US008799559B2

(12) United States Patent
Sharon et al.

(10) Patent No.: US 8,799,559 B2
(45) Date of Patent: Aug. 5, 2014

(54) ENDURANCE ENHANCEMENT CODING OF COMPRESSIBLE DATA IN FLASH MEMORIES

(75) Inventors: Eran Sharon, Rishon Lezion (IL); Idan Alrod, Herzliya (IL)

(73) Assignee: Sandisk Technologies Inc., Plano, TX (US)

( * ) Notice: Subject to any disclaimer, the term of this patent is extended or adjusted under 35 U.S.C. 154(b) by 217 days.

(21) Appl. No.: 13/331,773

(22) Filed: Dec. 20, 2011

(65) Prior Publication Data

US 2013/0103891 A1 Apr. 25, 2013

Related U.S. Application Data

(60) Provisional application No. 61/550,694, filed on Oct. 24, 2011.

(51) Int. Cl.
*G06F 12/00* (2006.01)
(52) U.S. Cl.
USPC ............................ 711/103; 711/170; 711/202
(58) Field of Classification Search
None
See application file for complete search history.

(56) References Cited

U.S. PATENT DOCUMENTS

| 7,388,781 | B2 | 6/2008 | Litsyn et al. |
| 7,643,342 | B2 | 1/2010 | Litsyn et al. |
| 7,697,325 | B2 | 4/2010 | Sprouse et al. |
| 7,990,766 | B2 | 8/2011 | Litsyn et al. |
| 2008/0031042 | A1 | 2/2008 | Sharon |
| 2008/0158948 | A1* | 7/2008 | Sharon et al. ............ 365/185.02 |
| 2010/0180179 | A1 | 7/2010 | Lastras-Montano |
| 2010/0281340 | A1 | 11/2010 | Franceschini et al. |
| 2010/0284537 | A1 | 11/2010 | Inbar |
| 2011/0029754 | A1 | 2/2011 | Litsyn et al. |
| 2011/0093652 | A1 | 4/2011 | Sharon et al. |
| 2011/0138104 | A1 | 6/2011 | Franceschini et al. |
| 2011/0138105 | A1 | 6/2011 | Franceschini et al. |
| 2011/0276749 | A1 | 11/2011 | Litsyn et al. |

FOREIGN PATENT DOCUMENTS

WO 2010092536 A1 8/2010

* cited by examiner

*Primary Examiner* — Shawn X Gu
(74) *Attorney, Agent, or Firm* — Toler Law Group, PC

(57) ABSTRACT

Methods described in the present disclosure may be based on a direct transformation of original data to "shaped" data. In a particular example, a method comprises generating a first portion of output data by applying a mapping of input bit sequences to output bit sequences to a first portion of input data, updating the mapping of the input bit sequences to the output bit sequences based on the first portion of the input data to generate an updated mapping, reading a second portion of the input data, and generating a second portion of the output data by applying the updated mapping of the input bit sequences to the output bit sequences to the second portion of the input data.

54 Claims, 11 Drawing Sheets

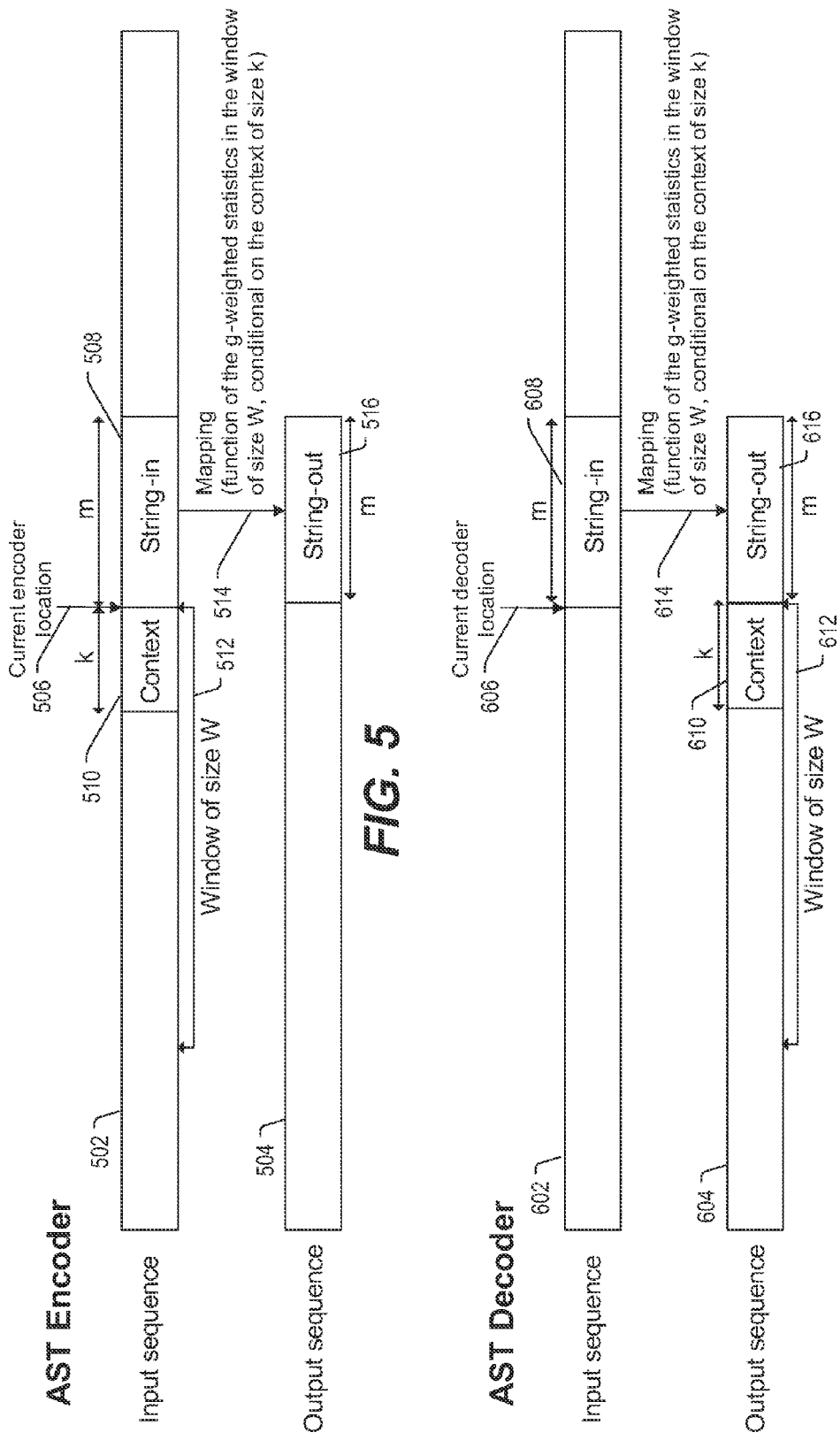

US 8,799,559 B2

ENDURANCE ENHANCEMENT CODING OF COMPRESSIBLE DATA IN FLASH MEMORIES

CROSS-REFERENCE TO RELATED APPLICATIONS

The present application claims priority to U.S. Provisional Application No. 61/550,694, filed Oct. 24, 2011, which application is hereby incorporated by reference in its entirety.

BACKGROUND

Data stored in a memory, such as a flash memory, may cause wearing of the memory. For example, programming flash memory cells to have a high threshold voltage may cause faster wearing of the cells as compared to programming the cells to a lower threshold voltage or retaining the cells in an erased state. If data to be stored is compressible, the data may be compressed and the compressed data may be encoded prior to storage to generate encoded data that causes less memory wear. For example, the encoded data may use a greater proportion of data values that are represented using low threshold voltages and a lesser proportion of data values that are stored using high threshold voltages. However, performing compression and encoding of input data in a data storage device introduces latencies when reading data and when writing data. In addition, performing compression and encoding of input data in a data storage device may increase power consumption of the data storage device and may increase a cost of manufacture of the data storage device.

BRIEF DESCRIPTION OF THE DRAWINGS

FIG. 5 is a general diagram of a first embodiment of adaptive shaping transformation (AST) encoding;

FIG. 6 is a general diagram of a second embodiment of adaptive shaping transformation (AST) decoding;

DETAILED DESCRIPTION

Figure 1:
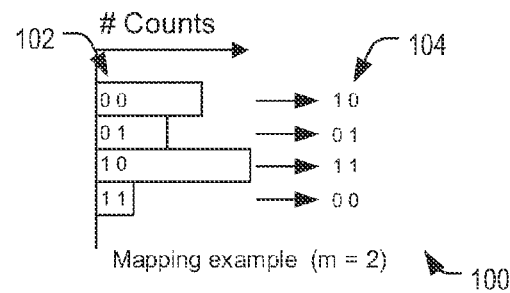
FIG. 1 is a general diagram illustrating a particular embodiment of mapping sub-strings of an input sequence to sub-strings of an output sequence.

Flash memories may have limited endurance to Write/Erase (W/E) cycles and may have limited data retention. As a number of W/E cycles performed in a flash memory increases, a data retention capability of the memory may be reduced and a possibility of failures may increase. For example, an oxide insulation layer may wear due to electrons that pass through the oxide insulation layer during W/E cycles and generate electron trap sites. A failure may manifest as a failure to erase or program a block or as reduced data retention ability of memory cells, as illustrative examples.

In some flash memory fabrication processes, as cell dimensions shrink, W/E cycling endurance may be reduced and may become a limiting factor that may affect commercial viability of the flash memory.

Moreover, in some cases there may be special blocks of a flash memory, such as blocks used by flash management software or blocks used for binary caching, that experience more W/E cycles than the rest of the memory and that may be affected by W/E cycle endurance of the memory.

Data encoding may be used to enhance flash memory endurance by means of "shaping" a distribution of input data bits to induce a distribution of a number of cells programmed to each programming level of a flash memory.

Methods described in the present disclosure may be based on a direct transformation of original data to "shaped" data. As such, the disclosed methods may have less complexity (e.g. smaller footprint on a memory controller size) and less power consumption than methods that first compress data and then encode the compressed data. Moreover, the disclosed methods may be performed "on-the-fly" and hence may not incur a latency penalty and may allow higher throughput. The disclosed methods may utilize an inherent redundancy in compressible data in order to achieve endurance enhancement and error reduction.

In scenarios where a significant portion of data received from a host ("host data") is compressible (as in solid state drive (SSD) applications where host files, such as .doc, .ppt, .txt, .xls, . . . can be significantly compressed), the disclosed methods can provide significant gain in cycling endurance and data retention. Data to be stored in the flash memory may be considered as a binary string. When the data is compressible, choosing an integer "m" and partitioning the input data string into sub-strings of length m will result (with a high probability) in a non-uniform distribution of the $2^m$ sub-strings of length m in the data. (It sometimes may happen that the distribution of the sub-strings is uniform, but this is unlikely. For example, the string 010101010 . . . is highly compressible, but choosing m=1, would result in a uniform distribution of 1-s and 0-s (i.e. sub-strings "1" and "0" occur with equal frequency). The same is true for any m and for a string which periodically repeats the $2^m$ sub-strings of length m. However, in most cases when the data is compressible, choosing any m will result in a non-uniform distribution of the $2^m$ sub-strings of length m. As an example, for m=3, the 8 sub-strings 000, 001, 010, 011, 100, 101, 110, 111 are likely non-uniformly distributed in the input data if the input data is compressible.

A shaping transformation to input data may include:
1. Static Shaping Transformation (SST): Defining a static transformation and a key. Storing the key in a flash memory; or 2. Adaptive Shaping Transformation (AST): Defining an adaptive transformation without an additional key.

According to a method using a SST, given compressible input data, the input data may be partitioned into sub-strings of length m, where m is a predefined integer, and a substitution transformation may be applied to the sub-strings of length m, such that each sub-string is mapped to a (possibly different) sub-string of length m. The substitution transformation may be a permutation of the sub-strings of length m, and the specific permutation may be defined to satisfy some logical condition. For example, the permutation may be a shaping permutation to reduce a distribution of 0-s in the transformed string. A predefined ordering may be applied to the sub-strings according to a particular logical condition, (e.g. the first sub-string may be 111 . . . 1, followed by the m sub-strings with 1 appearance of 0, followed by the sub-strings with 2 0-s in a sub-string etc. until the last sub-string that may be all 0-s). In addition, a dynamic ordering may be defined according to a distribution of the sub-strings in the input data, such that a most popular sub-string may be first, followed by all the other sub-strings according to their popularity. In case of a tie, the order can be decided in any specified way, such as by using a random choice. The two sequences of sub-strings (i.e. the sequence according to the predefined ordering and the sequence according to the dynamic ordering) can be linked such that the permutation will map the i-th sub-string in the second sequence to the i-th sub-string in the first sequence.

FIG. 1 illustrates a particular embodiment of a mapping 100 of input sub-strings 102 to output sub-strings 104 for m=2. A histogram may be generated based on counting how many times each 2-bit substring appears in an input sequence. The most frequent input substring (i.e. 1 0 in FIG. 1) is mapped to the output substring 1 1. The next two most frequent input substrings (0 0 and 0 1) are mapped to the output substrings 1 0 and 0 1, respectively. The least frequent input substring (1 1) is mapped to the output substring 0 0. As a result of this mapping, the number of 0's in the output sequence is smaller than the number of 0's in the input sequence.

After the transformation is applied to the sub-strings, the transformed data may be stored in a number M of flash memory cells, where each cell stores L bits. For example, in a flash memory that stores 3 bits per cell, L=3. (In other embodiments, L can have a non-integer value. For example, if each cell in a flash memory can be programmed to one of five valid states, $L=\log_2(5) \approx 2.32$.) A key to the transformation may be stored with the transformation. The key can be stored in $m \cdot 2^m$ bits (where m is a length of the sub-strings) in the form of a table of $2^m$ rows, each row corresponding to a predefined string of m bits. For example, each row of the table may correspond to a predefined string that is the binary expansion of the index of the row. To illustrate, for m=3, a row of the table with index "3" may correspond to the string "011". The m bits stored in the row of the table can correspond to the string which is transformed to the predefined string (alternatively the m bits stored in the row of the table can correspond to the string which the predefined string is transformed into). In the example shown in FIG. 1, the mapping description can be stored using $2*2^2=8$ bits by specifying the input substrings from the most frequent to the least frequent—i.e. 1 0, 0 0, 0 1, 1 1. Increasing m by 1 more than doubles the storage requirements for the key. A value of m may be chosen to achieve an effective shaping without requiring an unacceptably large amount of memory to store the key.

SST may include dividing a length n input bit sequence into m bit strings and counting how many strings exist from each type (i.e. generate $2^m$ counters). A one-to-one mapping function from input strings sorted from the most frequent to the least frequent, according to the $2^m$ counters, into output strings sorted according to a descending number of 1's in the string (i.e. from the all 1's string to the all 0's string) may be defined. The mapping function may be used to map each input string into an output string. The resulting bit sequence may be output together with the $2^m*m$ bits that define the mapping function that was used for converting the input bit sequence into the output bit sequence.

SST applied to the input string generates a second string. The second string may be partitioned to sub-strings of length L where L is a number of bits that can be stored in a single cell of a flash memory (e.g. L=3 for a 3 bit multi-level cell (MLC) flash memory cell). The sub-strings may be mapped into states in a range from 0 to $2^L-1$ and programmed to the flash memory.

Figure 2:
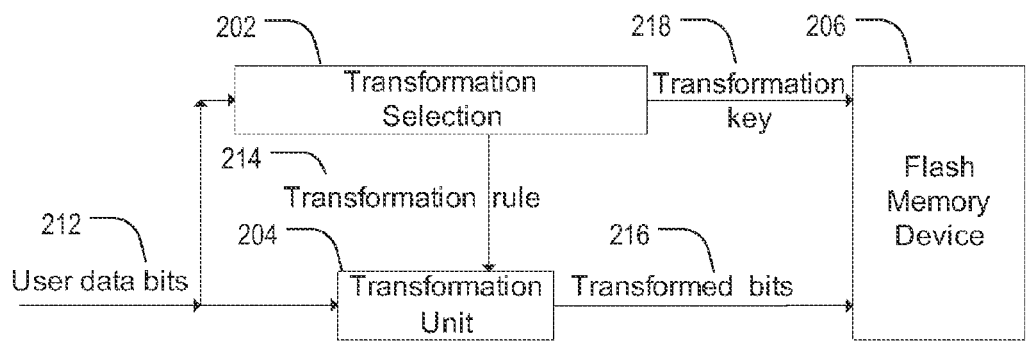
FIG. 2 is a block diagram illustrating a particular embodiment of a data storage operation at a data storage device configured to transform input data bits to transformed data bits according to a static shaping transformation (SST)
Figure 3:
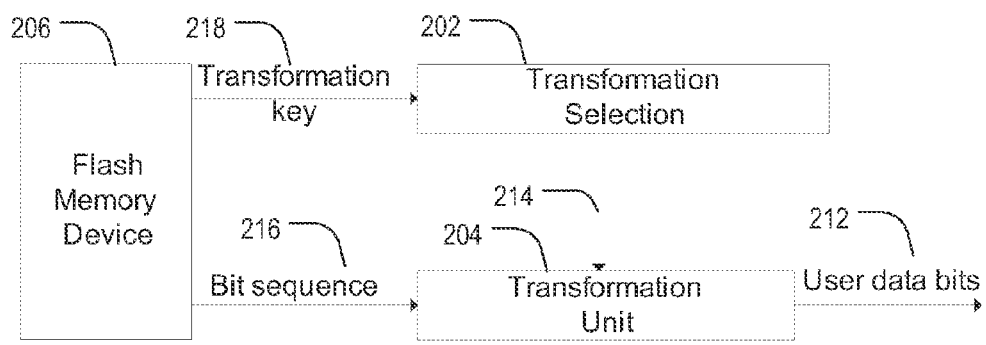
FIG. 3 is a block diagram illustrating a data read operation at the data storage device of FIG. 2.

Programming and reading data flows are illustrated in FIGS. 2 and 3. FIG. 2 depicts a particular embodiment of programming user data to a memory. A particular embodiment of reading from a flash memory is depicted in FIG. 3. In FIGS. 2 and 3, other elements (such as error correction coding (ECC) and scrambling that may be performed in conjunction with SST) are omitted.

FIG. 2 illustrates encoding data in a device that includes a transformation selection engine 202 and a transformation unit 204 coupled to a flash memory device 206. User data bits 212 are received and provided to the transformation selection engine 202 and the transformation unit 204. The transformation selection engine 202 provides a transformation rule 214 to the transformation unit 204. For example, the transformation selection engine 202 may generate a histogram of sub-sequences in the user data bits 212 and select a mapping of input sub-sequences to output sub-sequences, such as the mapping illustrated in FIG. 1, that is provided to the transformation unit 204. The transformation selection engine 202 may also output a transformation key 218. The transformation unit 204 may apply the transformation rule 214 to the user data bits 212 to generate transformed bits 216. The transformed bits 216 and the transformation key 218 may be stored in the flash memory device 206.

FIG. 3 illustrates decoding the transformed data of FIG. 2 in a device that includes the transformation selection engine 202, the transformation unit 204, and the flash memory device 206 of FIG. 2. The bit sequence 216 and the transformation key 218 may be read from the flash memory device. 206. The transformation key 218 may be provided to the transformation selection engine 202. The transformation selection engine may provide a transformation rule 214 to the transformation unit 204 to enable decoding of the bit sequence 216. The transformation unit 204 may apply the transformation rule 214 to the bit sequence 216 to generate the user data bits 212.

Figure 4:
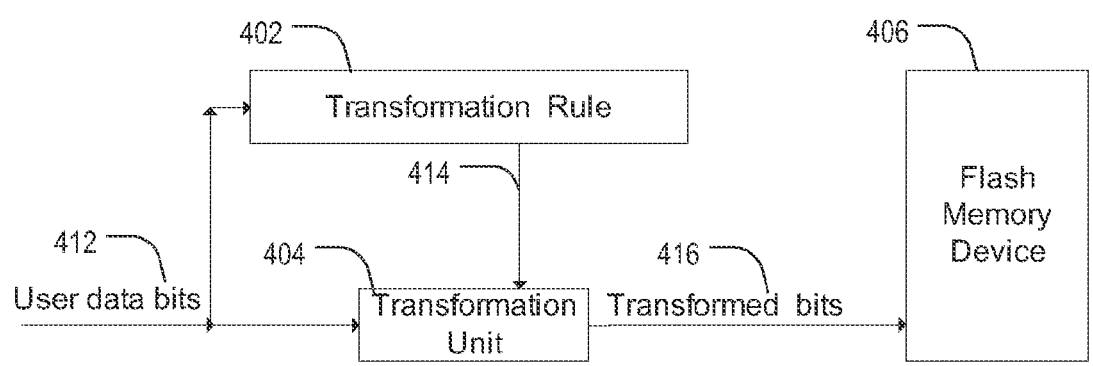
FIG. 4 is a block diagram illustrating a particular embodiment of a data storage operation at a data storage device configured to transform input data bits to transformed data bits according to an adaptive shaping transformation (AST)

FIG. 4 illustrates an embodiment of encoding data using an Adaptive Shaping Transformation (AST) in a device that includes a transformation rule engine 402 and a transformation unit 404 coupled to a flash memory device 406. User data bits 412 are received and provided to the transformation rule engine 402 and the transformation unit 404. The transformation rule engine 402 provides a transformation rule 414 to the transformation unit 404. For example, the transformation rule engine 402 may generate and update one or more histograms of sub-sequences in the user data bits 412 as the user data bits 412 are received and select a mapping of input sub-sequences to output sub-sequences for each successive input sub-sequence, as described in further detail with respect to FIGS. 5-7. The transformation unit 404 may apply the mappings received from the transformation rule engine 402 for each input sub-sequence to the corresponding sub-sequence of the user data bits 212 to generate transformed bits 416. The transformed bits 416 may be stored in the flash memory device 406.

- AST may be based on a deterministic fixed length transform from n bits into N bits, where N≥n (if no redundancy is to be added, then N=n may be used)
- AST may be performed without storing any side information (e.g. key or mapping) in the memory with transformed bits.
- AST is adaptive to changes in characteristics of the input data sequence.

In a particular embodiment, AST encoding includes:
- Receive an input bit sequence.
- At the j-th encoding step (e.g. j may be initialized to 0 and may be incremented by 1 at each encoding step), map the j-th input bit string of the input bit sequence into an output bit string, such that the mapping function used for converting the j-th input bit string into the j-th output bit string is a function of at least some of the previous bits in the input bit sequence. The output bit string size may be greater or equal to the input bit string size. Successive encoding steps may be performed until the entire input bit sequence is transformed.
- Program the transformed bit sequence into a flash memory.

In a particular embodiment, AST decoding includes:
- Read the transformed bit sequence from the flash memory.
- At the j-th decoding step: map the j-th transformed bit string of the transformed bit sequence into an output bit string, such that the mapping function used for converting the j-th transformed bit string into the j-th output bit string is a function of at least some of the previous bits in the output bit sequence. The output bit string size may be smaller or equal to the transformed bit string size. Processing may continue until the entire transformed bit sequence is decoded.
- Transfer the decoded bit sequence to a host.

Because selection of mappings in the encoder may be based only on the "history" (e.g. on at least some of the previously processed bits) there may be no need to store any side information—all mapping decisions can be traced back in the decoder by following a same procedure as the encoder.

In a particular embodiment, the input and output bit string of the encoder (and decoder) are of fixed size m so that at each step of encoding a length m input bit string is mapped into a length m output bit string. The encoder transforms a length n bit sequence into a length n transformed bit sequence (i.e. the encoder preserves a length of the sequence). In another embodiment, an encoder can map a fixed size length m input bit string into a fixed size length M output bit string, where M>m. The encoder may transform a length n bit sequence into a length N transformed bit sequence, where N>n. The encoder may introduce redundancy and in return may induce stronger "shaping" over the output transformed bit sequence.

A mapping function used for converting the j-th input bit string into the j-th output bit string may be chosen based on statistics of the previous bits in the sequence. The statistics of the previous bits may be used for predicting the value of the next input bit string. Based on this prediction a mapping may be chosen that maps the bit strings that are estimated as more probable into output bit strings that satisfy the desired condition (e.g. having a small fraction of 0's). For example, a mapping function may be chosen based on a number of occurrences (i.e. frequency) of each possible string in the previous bits of the sequence such that the more frequent input bit string will be mapped into output bit strings having a smaller fraction of 0's.

As the previous bits ("history") are used for predicting the next input bit string, the prediction can be based on the previous bits that are most indicative for the next input bit string without using all the bits in the "history" with equal weight for sake of the prediction. For example, the "near history" may be more indicative of what is likely to be the next input bit string than the "far history". Several variants of "history" weighting are described herein. A mapping may be a function of statistics of previous bits in the input sequence, according to the following variants:

- When choosing a mapping, consider conditional statistics, given a context of the last k bits.
- Collect statistics on a sliding window of size W—i.e. consider more recent statistics which are based on a window of the most recent W bits.
- Give different weight to strings in the window—e.g. give more weight to a recent string than an older string. A weighting function (denoted as g) can be selected—e.g. a flat weighting window $g(j)=1$ (no weighting), a linear weighting window $g(j)=j$, an exponential weighting window $g(j)=c^j$ (for some constant c), an adaptive weighting window (weights change during the encoding based on the input sequence).
- When using a weighted (or non-weighted) window, the window size may be infinite ($W=\infty$).
- Utilize information on repetitive data patterns in order to determine the relevant history that would provide the best prediction for each bit or string. For example, if it is known that the data is likely to contain repetitions on a level of Double Words (i.e. 32 bit chunks), then it would make sense to predict the next input byte from looking on previous bytes with the same relative location within a Double Word. To illustrate, when trying to predict byte number 56, it would be better to consider previous bytes 52, 48, 44, 40, . . . as opposed to performing the prediction based on all the previous bytes (i.e. bytes 55, 54, 53, 52, . . . . Another example may be trying to predict the next bit, when there is prior information that repetition on a byte level is likely. In this case it would be better to estimate the j'th bit by looking at the previous bits j-8, j-16, j-24, j-32, . . . . Operatively this means that the mapping is chosen based on the statistics of relevant bits in the history and not on all the history.

An AST mapping method can be selected using four parameters (e.g. AST(m,k,g,W)), where m is a substring length, k is a context length, g is a weighting function and W is a window size. The weighting function g can be used for assigning appropriate weight to the bits in the window (for sake of the prediction). It may also be used for selecting the relevant bits within the window (e.g. assigning 0 weight to irrelevant bits).

As an example, the following data structures may be maintained by an AST encoder:
- $2^k$ tables, one for each context
- Each table having $2^m$ entries, where each entry stores an input string and a corresponding number of occurrences (i.e. a count) of the input string. The table entries may be sorted based on their counts (i.e. from the most frequent to the least frequent).
- A fixed output mapping may be determined, by sorting all the (length m) output strings according to the number of 0-s in the string, from the all 1-s string to the all 0-s string. Strings with equal number of 0-s are sorted in lexicographic order or according to any other predetermined order. An illustrative order for output strings having the same number of 0's is according to disturbance effects the strings are expected to induce on flash memory cells (i.e. according to disturbance diminishing strength).

An example of AST encoding and decoding may be performed as follows:

AST Encoding (Example):

Initialization: start with all counts in the tables zeroed. Copy first k bits from an input sequence to an output sequence (possibly using some default predetermined mapping). Set j=k+1.

Step 1—Encoding bits j to j+m−1: choose the table according to the k bit context and use the table for mapping a next m bit input string into an m bit output string.

Step 2—Update tables: increment by g(j) the counter corresponding to the m bit input string starting at location j, in the table corresponding to its k bit context. Decrement by g(j−W) the counter corresponding to the m bit input string starting at location j−W, in the table corresponding to its k bit context. Perform a local sorting operation by pushing up/down the updated entries to their correct location so that entries are sorted according to the counts.

Set j=j+m. If j≥n, encoding is finished. Otherwise processing returns to step 1.

FIG. 5 illustrates an example of AST encoding at an AST encoder. An input sequence 502 is transformed into an output sequence 504 according to an adaptive mapping of m-bit input strings to m-bit output strings. A current encoder location 506 indicates that bits of the input sequence 502 at earlier locations (i.e. to the left of the current encoder location 506) have been encoded to the output sequence 504. An m-bit input string 508 at the current encoder location 506 is mapped to an m-bit output string 516 according to a mapping 514. The mapping 514 is a function of weighted statistics of m-bit input strings in a window 512 of size W, according to a context 510 of size k. For example, the weighted statistics may be weighted by a flat weighting window (e.g. g(j)=1 (no weighting)), a linear weighting window (e.g. g(j)=j), an exponential weighting window (e.g. g(j)=c (for some constant c)), or an adaptive weighting window (where weights change during the encoding based on the input sequence).

AST Decoding (Example):

Initialization: start with all counts in the tables zeroed. Copy first k bits from an input sequence to an output sequence (possibly using some default predetermined demapping). Set j=k+1.

Step 1—Decoding bits j to j+m−1: choose a table according to a k bit context (taken from the output sequence) and use the table for demapping a next m bit input string into an m bit output string.

Step 2—Update tables: increment by g(j) the counter corresponding to an m bit output string starting at location j, in a table corresponding to its k bit context. Decrement by g(j−W) the counter corresponding to the m bit output string starting at location j−W, in the table corresponding to its k bit context. Perform a local sorting operation by pushing up/down the updated entries to an updated location so that entries are sorted according to the counts.

Set j=j+m. If j≥n decoding is finished. Otherwise, processing returns to step 1.

FIG. 6 illustrates an example of AST decoding. An input sequence 602 is transformed into an output sequence 604 according to an adaptive mapping of m-bit input strings to m-bit output strings. A current decoder location 606 indicates that bits of the input sequence 602 at earlier locations (i.e. to the left of the current decoder location 606) have been decoded to the output sequence 604. An m-bit input string 608 at the current encoder location 606 is mapped to an m-bit output string 616 according to a mapping 614. The mapping 614 is a function of weighted statistics of m-bit output strings in a window 612 of size W, according to a context 610 of size k. For example, the weighted statistics may be weighted by a flat weighting window (e.g. g(j)=1 (no weighting)), a linear weighting window (e.g. g(j)=j), an exponential weighting window (e.g. $g(j)=c^j$ (for some constant c)), or an adaptive weighting window (where weights change during the encoding based on the input sequence).

Due to similarities in encoding and decoding, a common hardware engine can be used for both encoding and decoding.

Figure 7:
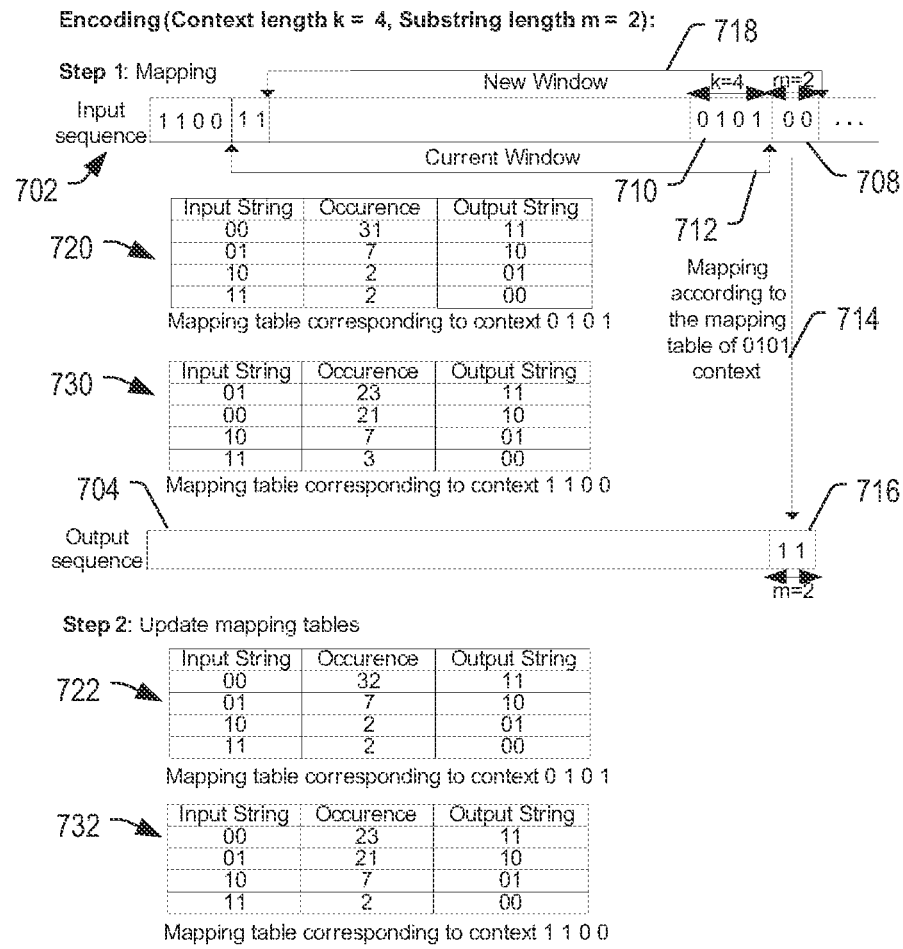
FIG. 7 is a general diagram of a third embodiment of adaptive shaping transformation (AST) encoding.

An illustration of an encoder with string length m=2, context of length k=4, flat weighting function g(j)=1 (for any j) and a window of size W and is depicted in FIG. 7. An input sequence 702 is mapped to an output sequence 704 with a mapping 714 being determined for each m-bit input string in the input sequence 702, such as a representative m-bit input string 708 according to a k-bit context. For example, a representative first mapping table 720 corresponds to a context of "0101" and a representative second mapping table 730 corresponds to a context of "1100". To illustrate, the first mapping table 720 includes a count of occurrences of each m=2 bit input string that has been detected by the encoder during encoding of the input sequence 702 that follows the bit sequence "0101" and that occurs within a window 712 of size W of an occurrence of the context "0101" 710.

The input string "00" 708 that follows the occurrence of the context "0101" 710 in the input sequence 702 is mapped by the encoder to an output string based on statistics of the input sequence 702. For example, the encoder selects a mapping table according to the current context (i.e. the mapping table 720 corresponding to the context "0101") and determines that the input string "00" 708 is mapped to the output string "11" 716.

After mapping the input string 708 to the output string 716, the encoder advances m=2 bit positions in the input sequence 702 and updates the mapping tables (e.g. tables 720 and 730) according to a new window 718. For example, an m=2 bit sequence "11" (following a context "1100") at a left-most position of the window 712 is not included in the new window 718. In addition, the m=2 bit sequence "00" 708 (following the context "0101" 710) that is not included in the window 712 is included in the new window 718. The encoder updates the mapping table 720 for the context "0101" to increment a number of occurrences of "00" to generate an updated mapping table 722. The encoder also updates the mapping table 730 for the context "1100" to decrement a number of occurrences of "11" to generate an updated mapping table 732.

In the illustrated updated tables 722 and 732, the mappings have not changed from the prior tables 720 and 730, respectively. However, if updating one of the mapping tables causes an order of the input strings to change, a mapping of the input strings to output strings would be adjusted. For example, if the updated table 722 has 3 occurrences of the "11" input string but only two occurrences of the "10" input string, the encoder would re-map the "11" input string to the "01" output string and the "10" input string to the "00" output string.

There may be various implementations of AST. Several examples are provided below:

1. Adaptive weighting function, in which a weight given to input string j is a function of some metric computed at step j.

2. Use several AST parameter sets (AST($m_1,k_1,g_1,W_1$), AST($m_2,k_2,g_2,W_2$), . . . ) and select a set for performing mapping at each step, where a parameter set selection is based on tracking an efficiency of each parameter set "on-the-fly" and choosing a most efficient set at each point.
3. Use an infinite weighted window—one table update per step (as opposed to two table updates—one for the string getting into the window and one for the string getting out of the window). In order to give more weight to recent strings, we can use a weighted window, where at step j the relevant counter is incremented by some function of j (e.g. linear window where the relevant counter is incremented by j, or exponential window where the relevant counter is incremented by $c\hat{\ }j$ for some constant c).
4. If a large context length k is to be used so that it is not practical to maintain $2^k$ tables, a table may be allocated for a given context when the context is first encountered. A very small number of contexts out of the $2^k$ possible contexts may be encountered (at most n/m contexts can be encountered for an input sequence of size n, the input sequence partitioned into substrings of length m).
5. If a large context length k is used, most of the counts in the table will be zeroed. An additional global table may be maintained and updated based on each string (regardless of a context of the string). At encoding step j, a mapping that is used is a mapping that is combined from the context-related table and the global table. The combined mapping table may be generated based on the context-related table, by sorting entries that have equal counts according to the order of entries in the global table.
6. A very simple example of AST that may have a very low hardware complexity and power consumption and that may be designed to reach very high throughputs (by using very large m values) is based on a simple inversion mapping. According to simple inversion mapping, each m-bit string is either mapped into the same m-bit string or an inverted m-bit string (i.e. the output bit string is either equal to the input bit string or to the inverted input bit string). The decision whether to invert the next input bit string or not can be based on counting the number of 0's in the window. If there are more 0's than 1's then it is predicted that the next input bit string will have more 0's than 1's and hence the input bit string will be inverted to produce the output bit string (in order to increase the probability that the output bit sequence will have more 1's than 0's). Otherwise, the output bit string is equal to the input bit string. It is also possible to use one or more of the variants that have been described, such as using an infinite window (i.e. simply counting the 0's encountered in the input bit string so far), or using a weighted window. A variant when using this method is to utilize information on repetitive patterns that can improve the "shaping" performance. For example, if it is likely that the data is repetitive on a byte level, then the decision whether to flip each bit or not may be based only on the previous bits having the same relative location within the byte. To illustrate, when taking the decision whether to flip bit j, consider only the number of 0's within the set of bits j-8, j-16, j-24, j-32, . . . . If the entire input bit sequence is made of repetitions of the byte 00001111, the input bit sequence has exactly 50% 0s. If a simple inversion based AST is used with m=8, then, at each encoding step, counting the number of 0's in the history would result in 50% of the bits being 0, and decision not to flip (or to flip) the input sequence. Hence, the resulting output bit sequence would also have 50% 0's and no "shaping" will be achieved. On the other hand, if the decision on each bit within the m=8 bits is taken based only on counting 0's in previous bits having the same position within the bytes, then for bit positions 0, 1, 2, 3 within the byte the count would show 100% 0's and the decision would be to flip the corresponding input bit, while for bit positions 4, 5, 6, 7 within the byte the count would show 0% 0's and the decision would be to keep the corresponding input bit as is. The resulting output bit sequence of the mapped bits would be the all 1's sequence, providing perfect "shaping".

In inversion based AST, no mapping tables need to be maintained and no sorting operations are done. The encoder/decoder hardware in this case includes simple 0's counter (or counters, in a variant that uses a different count per bit position within the m-bit string). This allows using very large m values and hence achieving very high AST encoding/decoding throughputs. Moreover the complexity and power footprint of this simple scheme may be negligible.

Both SST and AST enable the string length m that is used for defining the transformation to be independent of the cell resolution and can be used for SLC and MLC. Both SST and AST may have lower complexity compared to compression/decompression approaches and may be able to support higher throughput and lower latencies than compression/decompression approaches. SST and AST may be more convenient in terms of system considerations (e.g. fixed length code (not variable length code as in compression/decompression techniques) and avoids exceptions due to an encoded sequence being larger than a page size). SST and AST may be used for shaping other than 0's reduction by directly transforming a compressible length n bit sequence into a "shaped" length n bit sequence, where shaping can include any desired constraint (e.g. to minimize the probability of any selected data pattern).

In AST, the output string being the same length as the input string (i.e. a transformation from n bits to n bits) reduces system complexity as compared to a method that transform n bits to n bits+extra bits for a key. AST avoids storing any side information in the flash. Storing side information may introduce certain other system complications. For example, storing side information may require protection against errors in the flash possibly with a designated ECC. Furthermore, as the side information is not "shaped", the cells storing the side information may be worn out faster than the cells storing the "shaped" data, if countermeasures (which complicate the design) are not taken. Additionally, AST does not consume redundancy otherwise used by the ECC. AST enables more efficient shaping by using larger values of m. A length of the substring, m, may be limited only by the size of the tables that correspond to the encoder/decoder complexity. AST can adapt to changes in statistics of data along an input string, rather than being based on global statistics of an input bit sequence.

Constraining programmed data to increase a number of cells that remain erased and to reduce a probability of higher states results in less cell wearing and higher endurance (i.e. higher cycling and data retention of the flash memory).

An example of an AST implementation is illustrated. Suppose an incoming bit-stream is partitioned into strings of length 3, with a goal to generate an output stream with a minimal occurrence of 0-s and a maximal occurrence of 1-s, using an AST method. The substrings of length 3 may be sorted in ascending order of appearance of 0-s as shown in Table 1:

TABLE 1

| Substrings | |
|---|---|
| 111 | Fewest 0-s |
| 110 | |
| 101 | |
| 011 | |
| 100 | |
| 010 | |
| 001 | |
| 000 | Most 0-s |

An initial mapping may be the identity mapping which can be illustrated by setting two tables matching Table 1 side by side. This is illustrated in Table 2 with an additional column of counters counting the number of appearances of each tuple. The counters are initialized as all 0-s.

TABLE 2

| Counters | Input Tuples | | Output Tuples |
|---|---|---|---|
| 0 | 111 | → | 111 |
| 0 | 110 | → | 110 |
| 0 | 101 | → | 101 |
| 0 | 011 | → | 011 |
| 0 | 100 | → | 100 |
| 0 | 010 | → | 010 |
| 0 | 001 | → | 001 |
| 0 | 000 | → | 000 |

In an example where the input string 010111111000 . . . is received from the host:

1. Partition the input string to 3-tuples: 010, 111, 111, 000, . . . .
2. Look at the first tuple: 010.
  a. Map the first tuple according to the above mapping (i.e. 010→010)
  b. Increment the counter for 010 from 0 to 1 (indicating one occurrence of "010" has been counted in the input string)
  c. Sort the left table (e.g. using bubble sort), the index to sort over is the counter for each of the tuples. The result is a new mapping depicted in Table 3.

TABLE 3

| Counters | Input Tuples | | Output Tuples |
|---|---|---|---|
| 1 | 010 | → | 111 |
| 0 | 111 | → | 110 |
| 0 | 110 | → | 101 |
| 0 | 101 | → | 011 |
| 0 | 011 | → | 100 |
| 0 | 100 | → | 010 |
| 0 | 001 | → | 001 |
| 0 | 000 | → | 000 |

3. Look at the second tuple in the input string: 111.
a. Map the second tuple according to the above mapping (i.e. 111→110)
b. Increment the counter for 111 from 0 to 1
c. Sort the left table (e.g. using bubble sort), the index to sort over is the counter for each of the tuples. Since there is a tie between 010 and 111, the tie may be resolved by setting the more recent tuple 111 above the less recent tuple 010, as the more recent tuple is likely to be a better predictor of the next input tuple and hence may be mapped to an output tuple with less 0's. The result is a new mapping depicted in Table 4.

TABLE 4

| Counters | Input Tuples | | Output Tuples |
|---|---|---|---|
| 1 | 111 | → | 111 |
| 1 | 010 | → | 110 |
| 0 | 110 | → | 101 |
| 0 | 101 | → | 011 |
| 0 | 011 | → | 100 |
| 0 | 100 | → | 010 |
| 0 | 001 | → | 001 |
| 0 | 000 | → | 000 |

4. Look at the third tuple in the input string: 111.
a. Map the third tuple according to the above mapping (i.e. 111→111)
b. Increment the counter for 111 from 1 to 2, as shown in Table 5.

TABLE 5

| Counters | Input Tuples | | Output Tuples |
|---|---|---|---|
| 2 | 111 | → | 111 |
| 1 | 010 | → | 110 |
| 0 | 110 | → | 101 |
| 0 | 101 | → | 011 |
| 0 | 011 | → | 100 |
| 0 | 100 | → | 010 |
| 0 | 001 | → | 001 |
| 0 | 000 | → | 000 |

5. Look at the fourth tuple in the input string: 000.
a. Map the fourth tuple according to the above mapping (i.e. 000→000)
b. Increment the counter for 000 from 0 to 1
c. Sort the left table. The result is a new mapping depicted in Table 6.

In case of a tie (e.g. the counters of both the 000 and 010 tuples are equal to 1), the more recent tuple (i.e. 000 in the example) may be pushed above the less recent tuple (010 in this example) as part of the bubble sort. The reason is that it may be more likely that the more recent tuple will be a better predictor for the next tuple compared to the less recent tuple. Hence an overall lower occurrence of 0's may result from assigning an output tuple with fewer 0's to the more recent input tuple.

TABLE 6

| Counters | Input Tuples | | Output Tuples |
|---|---|---|---|
| 1 | 111 | → | 111 |
| 1 | 000 | → | 110 |
| 1 | 010 | → | 101 |
| 0 | 110 | → | 011 |
| 0 | 101 | → | 100 |
| 0 | 011 | → | 010 |
| 0 | 100 | → | 001 |
| 0 | 001 | → | 000 |

The encoded stream (i.e. the output) is thus: 010, 110, 111, 000 . . . . (In this example the number of 0-s increased but this is a transient of the beginning. Tracking longer sequences will result in an output with a reduced number of 0-s).

In a decoding example where a received bit stream is 010, 110, 111, 000 . . . . Begin with the initial table illustrated in Table 7:

TABLE 7

| Counters | Input Tuples | | Output Tuples |
|---|---|---|---|
| 0 | 111 | ← | 111 |
| 0 | 110 | ← | 110 |
| 0 | 101 | ← | 101 |
| 0 | 011 | ← | 011 |
| 0 | 100 | ← | 100 |
| 0 | 010 | ← | 010 |
| 0 | 001 | ← | 001 |
| 0 | 000 | ← | 000 |

1. Look at the first tuple of the received bit stream: 010.
   a. De-map the first tuple according to the above mapping (i.e. 010←010)
   b. Increment the counter for 010 from 0 to 1
   c. Sort the left table (e.g. using bubble sort), the index to sort over is the counter for each of the tuples. The result is a new mapping depicted in Table 8.

TABLE 8

| Counters | Input Tuples | | Output Tuples |
|---|---|---|---|
| 1 | 010 | ← | 111 |
| 0 | 111 | ← | 110 |
| 0 | 110 | ← | 101 |
| 0 | 101 | ← | 011 |
| 0 | 011 | ← | 100 |
| 0 | 100 | ← | 010 |
| 0 | 001 | ← | 001 |
| 0 | 000 | ← | 000 |

2. Look at the second tuple of the received bit stream: 110.
   a. De-map the second tuple according to the above mapping (i.e. 111←110) to get 111
   b. Increment the counter for 111 from 0 to 1
   c. Sort the left table. The index to sort over is the counter for each of the tuples. Since there is a tie between 010 and 111 (i.e. both have a counter value of "1"), the tie is resolved by setting the more recent tuple 111 above the less recent tuple 010, as the more recent tuple is likely to be a better predictor of the next input tuple and hence may be mapped to an output tuple with fewer 0's. The result is a new mapping depicted in Table 9.

TABLE 9

| Counters | Input Tuples | | Output Tuples |
|---|---|---|---|
| 1 | 111 | ← | 111 |
| 1 | 010 | ← | 110 |
| 0 | 110 | ← | 101 |
| 0 | 101 | ← | 011 |
| 0 | 011 | ← | 100 |
| 0 | 100 | ← | 010 |
| 0 | 001 | ← | 001 |
| 0 | 000 | ← | 000 |

3. Look at the third tuple of the received bit stream: 111.
   a. Map the third tuple according to the above mapping (i.e. 111←111)
   b. Increment the counter for 111 from 1 to 2, shown in Table 10.

TABLE 10

| Counters | Input Tuples | | Output Tuples |
|---|---|---|---|
| 2 | 111 | ← | 111 |
| 1 | 010 | ← | 110 |
| 0 | 110 | ← | 101 |
| 0 | 101 | ← | 011 |
| 0 | 011 | ← | 100 |
| 0 | 100 | ← | 010 |
| 0 | 001 | ← | 001 |
| 0 | 000 | ← | 000 |

4. Look at the fourth tuple of the received bit stream: 000.
   a. Map the fourth tuple according to the above mapping (i.e. 000←000)
   b. Increment the counter for 000 from 0 to 1
   c. Sort the left table. The result is a new mapping depicted in Table 11.

TABLE 11

| Counters | Input Tuples | | Output Tuples |
|---|---|---|---|
| 2 | 111 | ← | 111 |
| 1 | 000 | ← | 110 |
| 1 | 010 | ← | 101 |
| 0 | 110 | ← | 011 |
| 0 | 101 | ← | 100 |
| 0 | 011 | ← | 010 |
| 0 | 100 | ← | 001 |
| 0 | 001 | ← | 000 |

The decoded stream is thus: 010, 111, 111,000 . . . which is the original sequence.

The above example illustrates encoding the input string 010111111000 and decoding the encoded string 010110111000 using a global mapping table, and not based on a k-bit context, for clarity of explanation. In other embodiments, as described previously, separate mapping tables may be accessed for each sub-string according to a value of the sub-string's k-bit context.

Figure 8:
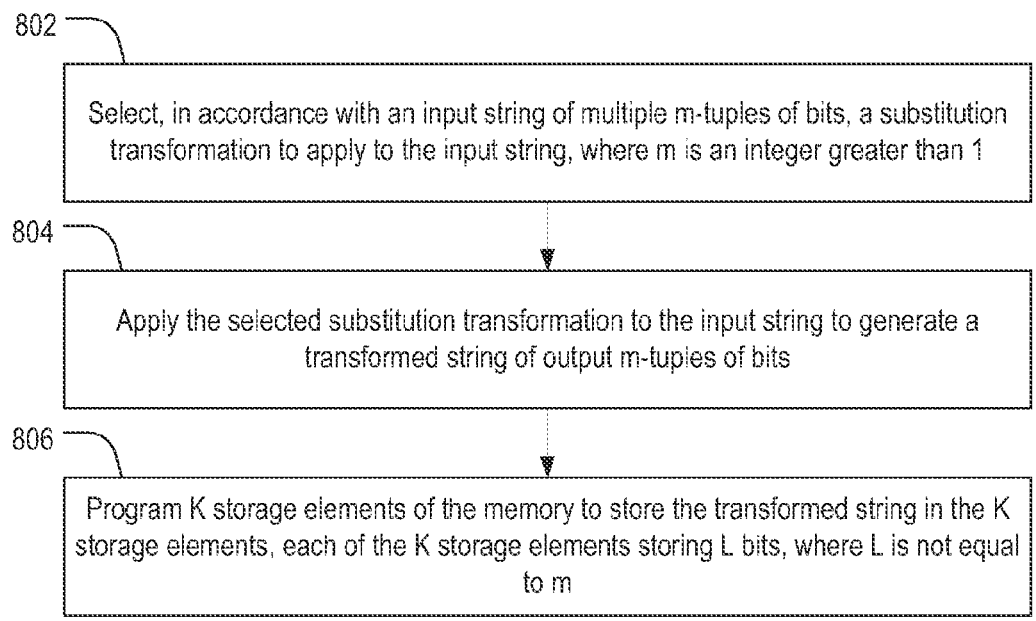
FIG. 8 is a flow diagram of an embodiment of a method of static shaping transformation (SST) encoding.

FIG. 8 illustrates a particular embodiment of an SST method of storing data. The method may be performed in a data storage device including a memory. The method includes selecting, in accordance with an input string of length n that includes multiple m-tuples of bits, a substitution transformation to apply to the input string, at 802. "m" is an integer greater than 1. For example, the substitution transformation may be selected by the transformation selection engine 202 of FIG. 2.

The selected substitution transformation is applied to the input string to generate a transformed string of (n/m) output m-tuples of bits, at 804. For example the selected substitution transformation may be applied by the transformation unit 204 of FIG. 2.

K storage elements of the memory are programmed to store the transformed string in the K storage elements, each of the K storage elements storing L bits, at 808. L is not equal to m. The memory may include a flash memory, such as the flash memory device 206 that stores transformed bits 216 of FIG. 2. For example, each of the K storage elements may be a memory cell of the flash memory. Programming the K storage elements may include logically partitioning the transformed string of (n/m) output m-tuples into L-tuples, assigning a number having a value in a range from 0 to $2^L-1$ to each L-tuple to represent a state of a storage element of the K storage elements, and programming the K storage elements in accordance with the assigned numbers.

The memory may be operative to selectively program each of the K storage elements to represent each binary number from 0 through $2^L-1$ as a respective one of $2^L$ states of each of the K storage elements. The substitution transformation may be selected to cause a distribution of respective states of the K storage elements to satisfy a predetermined logical condition. For example, m may be an integer multiple of L, the transformed string may be associated with exactly m/L cells, and the logical condition may be that states corresponding to lower threshold voltages appear more frequently than states corresponding to higher threshold voltages.

The substitution transformation may be selected to cause a distribution of the n/m output m-tuples of bits that satisfies a predetermined logical condition. For example, the predetermined logical condition may be that a count of 0 bits in the transformed string is less than a multiplicative product of p and n for a predetermined p.

The substitution transformation may be computed by sorting binary m-tuples according to a frequency of each binary m-tuple in the input string and assigning an output m-tuple to each m-tuple of the sorted m-tuples at least partially based on a number of 0 bits in each output m-tuple.

A key of the selected substitution transformation may be stored in the memory in association with the storage elements, such as the transformation key 218 of FIG. 2. For example, the key may have a number of bits less than or equal to a multiplicative product of m and $2^m$. The key may include an ordered list of the output m-tuples of bits corresponding to the substitution transformation.

Figure 9:
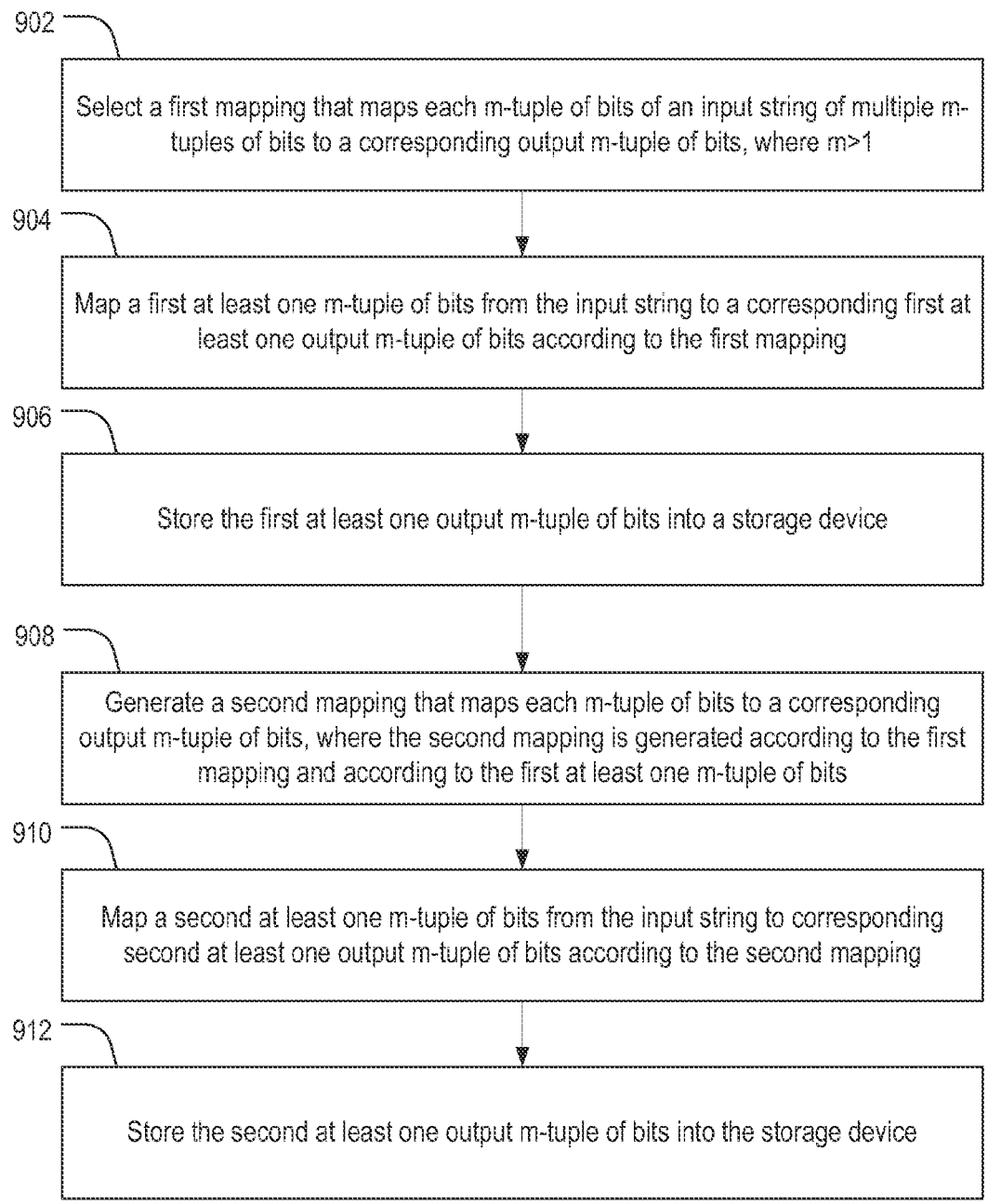
FIG. 9 is a flow diagram of a first embodiment of a method of adaptive shaping transformation (AST) encoding.

FIG. 9 illustrates an embodiment of an AST method of storing data corresponding to an input string of length n and including multiple m-tuples of bits, where m>1, into K storage elements, each storage element storing L bits. In some implementations, m may be equal to L. In other implementations, m may be different from L.

The method includes selecting a first mapping that maps each m-tuple of bits to a corresponding output m-tuple of bits, at 902. For example, the first mapping may be selected by the transformation rule engine 402 of FIG. 4. A first at least one m-tuple of bits from the input string is mapped to a corresponding first at least one output m-tuple of bits according to the first mapping, at 904. For example, one or more m-tuples of bits may be mapped by the transformation unit 404 of FIG. 4. The first at least one output m-tuple of bits is stored into a storage device, at 906. For example, the storage device may be the flash memory device 406 of FIG. 4.

A second mapping that maps each m-tuple of bits to a corresponding output m-tuple of bits is generated, at 908. The second mapping is generated according to the first mapping and according to the first at least one m-tuple of bits. To illustrate, the second mapping may be generated by the transformation rule engine 402 of FIG. 4.

The second mapping may be generated independent of every m-tuple other than the first at least one m-tuple of bits. For example, the mapping illustrated in Table 3 is used to map the second tuple of the input string to an output string, and is generated as a function of the first input tuple of the input string without being a function of any other tuple of the input string.

A second at least one m-tuple of bits from the input string is mapped to a corresponding second at least one output m-tuple of bits according to the second mapping, at 910. For example, one or more m-tuples of bits may be mapped by the transformation unit 404 of FIG. 4 using the second mapping received from the transformation rule engine 402. The second at least one output m-tuple of bits is stored into the storage device, at 912.

The second mapping may be generated such that the distribution of the stored output m-tuples satisfies a predetermined logical condition. For example, the predetermined logical condition may be that a count of 0 bits in an output string that includes the first at least one output m-tuple and the second at least one output m-tuple is less than a count of 0 bits in the input string. As another example, the predetermined logical condition may be that a percentage of 0 bits in an output string that includes the first at least one output m-tuple and the second at least one output m-tuple is less than a predefined number.

The second mapping may be generated such that the distribution of states of storage elements of the storage device in which an output string that includes the first at least one output m-tuple and the second at least one output m-tuple is stored satisfies a predetermined logical condition. In an example where the storage device is a flash memory storage device, the predetermined logical condition may be that a first count of cells having states corresponding to a threshold voltage below a first threshold is greater than a second count of cells having states corresponding to a threshold voltage above a second threshold voltage. In another example where the storage device is a flash memory storage device, the predetermined logical condition may be that a percentage of cells having states corresponding to a threshold voltage below a first threshold is greater than a predefined number.

Figure 10:
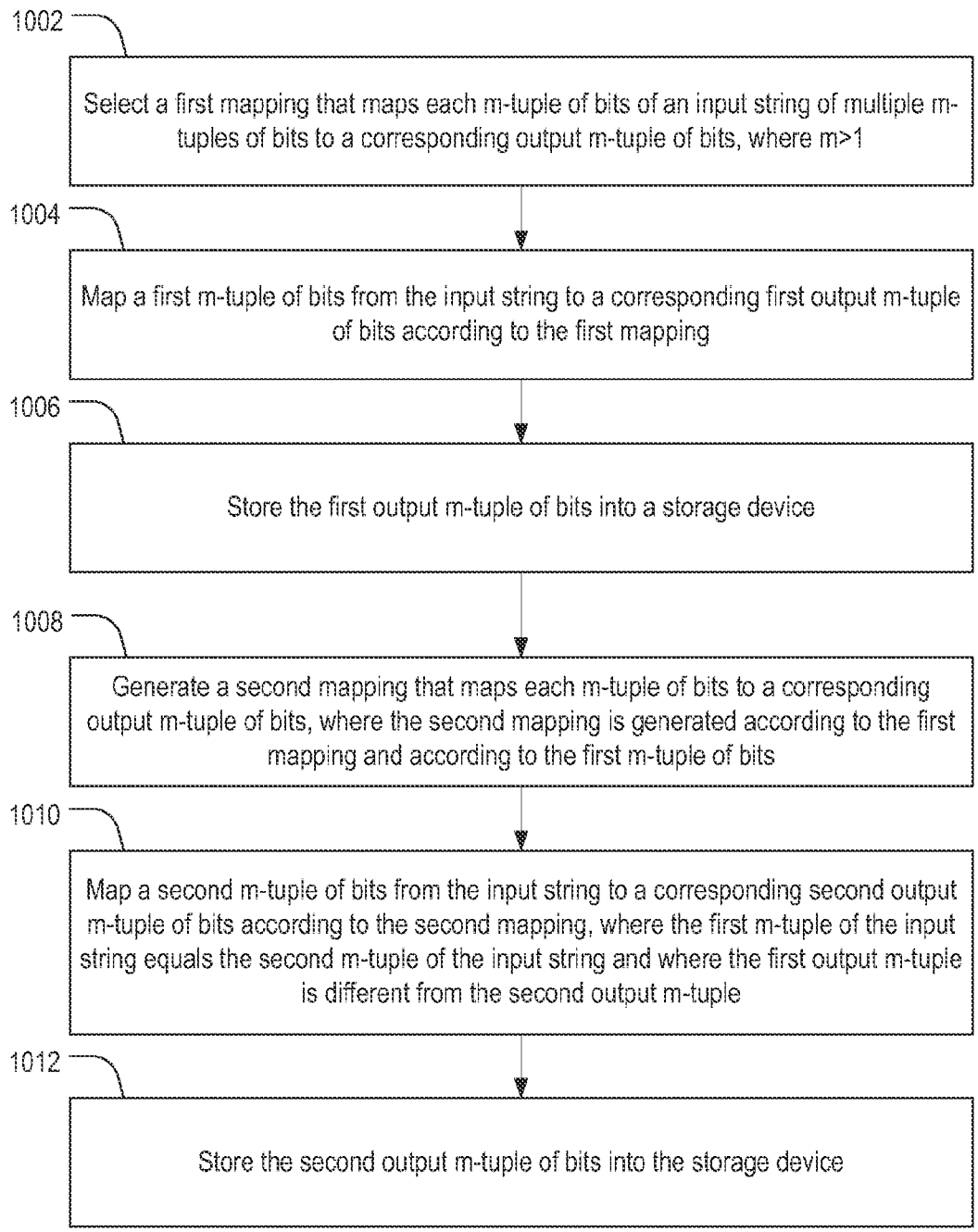
FIG. 10 is a flow diagram of a second embodiment of a method of adaptive shaping transformation (AST) encoding.

FIG. 10 illustrates an embodiment of a method of storing data corresponding to an input string of length n including multiple m-tuples of bits (m>1) into K storage elements. Each storage element stores L bits. The method includes selecting a first mapping that maps each m-tuple of bits to a corresponding output m-tuple of bits, at 1002. A first m-tuple of bits from the input string is mapped to a corresponding first output m-tuple of bits according to the first mapping, at 1004. The first output m-tuple of bits is stored into a storage device, at 1006. For example, the first mapping may be selected by the transformation rule engine 402 of FIG. 4, the first m-tuple of bits may be mapped by the transformation unit 404, and the first output m-tuple of bits may be stored to the flash memory device 406 of FIG. 4.

A second mapping is generated that maps each m-tuple of bits to a corresponding output m-tuple of bits, at 1008. The second mapping is generated according to the first mapping and according to the first m-tuple of bits. A second m-tuple of bits from the input string is mapped to a corresponding second output m-tuple of bits according to the second mapping, at 1010. The second output m-tuple of bits is stored into the storage device, at 1012. For example, the second mapping may be generated by the transformation rule engine 402 of FIG. 4, the second m-tuple of bits may be mapped by the transformation unit 404, and the second output m-tuple of bits may be stored to the flash memory device 406 of FIG. 4.

The first m-tuple of the input string equals the second m-tuple of the input string, and the first output m-tuple is different from the second output m-tuple. To illustrate, following the example described in Tables 1-3, for an input string "010010 . . . ", the first 3-tuple "010" is mapped to the output 3-tuple "010" and the mapping table of Table 2 is updated as illustrated in Table 3. Using Table 3, the second 3-tuple "010" is mapped to the output 3-tuple "111". As a result, the first 3-tuple of the input string equals the second 3-tuple of the input string, but the first output 3-tuple "010" is different from the second output 3-tuple "111".

Generating the second mapping may not be a function of any m-tuple other than the first m-tuple of bits, such as described in the example illustrated in Tables 1-3. For example, Table 3 may be generated based on Table 2 and therefore may be a function of the first 3-tuple "010" in the input string without being a function of any other 3-tuple in the input string.

Figure 11:
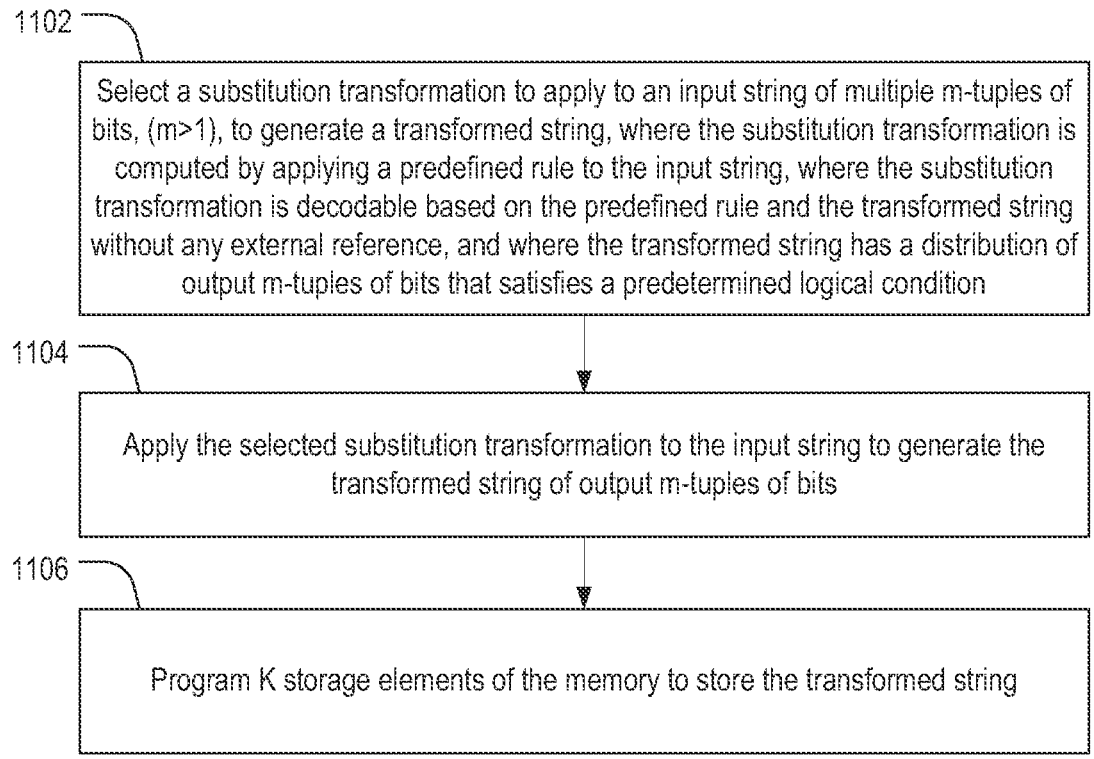
FIG. 11 is a flow diagram of a third embodiment of a method of adaptive shaping transformation (AST) encoding.

FIG. 11 illustrates a particular embodiment of an AST method of storing an input string of length n and including multiple m-tuples of bits (m>1) in K storage elements with each storage element storing L bits. The method includes selecting a substitution transformation to apply to the input string to generate a transformed string, at 1102. For example, the substitution transformation may be selected by the transformation rule engine 402 of FIG. 4. The substitution transformation is computed by applying a predefined rule to the input string. The substitution transformation is decodable based on the predefined rule and the transformed string without any external reference (e.g. without the transformation key 218 of FIG. 2). The transformed string has a distribution of n/m output m-tuples of bits that satisfies a predetermined logical condition.

The selected substitution transformation is applied to the input string to generate the transformed string of n/m output n-tuples of bits, at 1104. The K storage elements are programmed to store the transformed string, at 1106. For example, input string may be mapped by the transformation unit 404, and the output string may be stored to the flash memory device 406 of FIG. 4.

In some embodiments, application of the predefined rule to each particular m-tuple of the input string may depend only on values of previous m-tuples of the input string and the particular m-tuple. In other embodiments, application of the predefined rule to each particular m-tuple of the input string depends only on values of the particular m-tuple, such as the m-bit input string 508 of FIG. 5, and of previous m-tuples within a predefined window of m-tuples from the particular m-tuple in the input string, such as the window 512 of FIG. 5. The substitution transformation of a particular m-tuple in the input string may be computed according to a value of a context of k bits preceding the particular m-tuple in the input string, such as the k-bit context 510 of FIG. 5.

Figure 12:
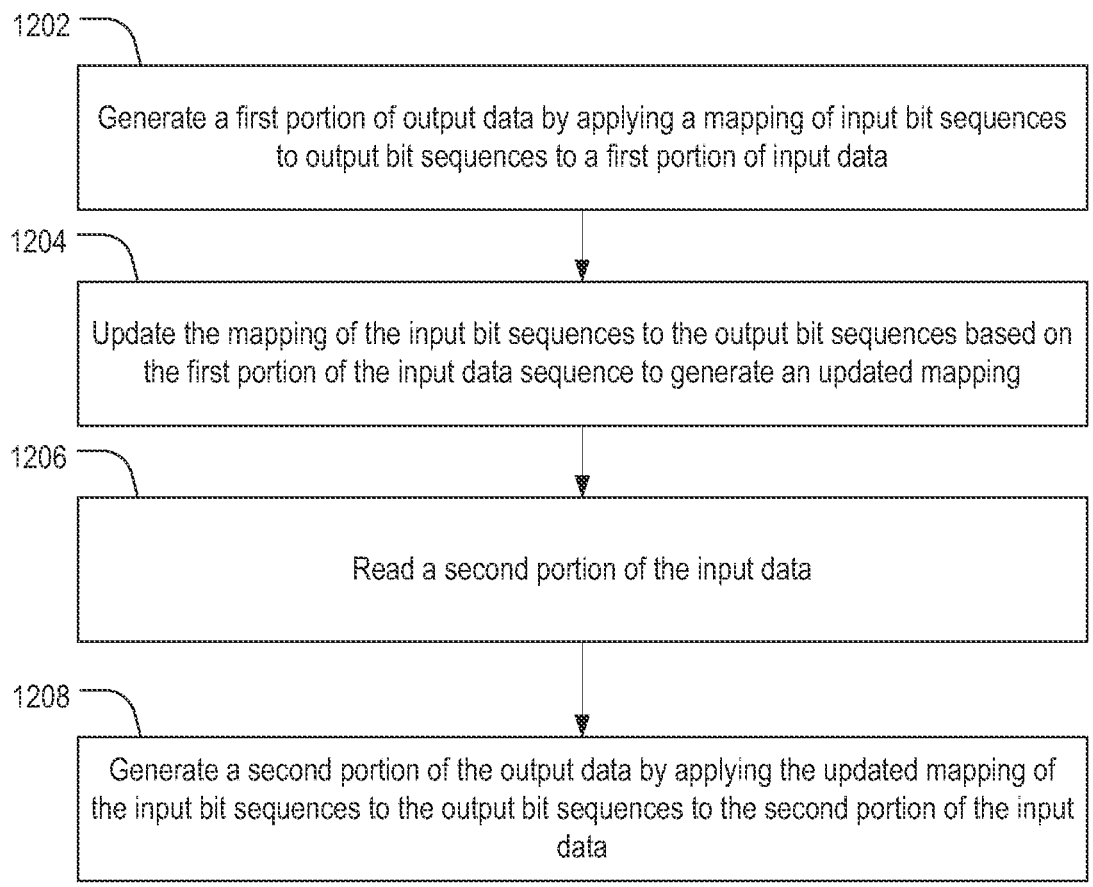
FIG. 12 is a flow diagram of a fourth embodiment of a method of adaptive shaping transformation (AST) encoding.

FIG. 12 illustrates an embodiment of an AST method. A first portion of output data is generated by applying a mapping of input bit sequences to output bit sequences to a first portion of input data, at 1202. The mapping of the input bit sequences to the output bit sequences is updated based on the first portion of the input data sequence to generate an updated mapping, at 1204. A second portion of the input data is read, at 1206, and a second portion of the output data is generated by applying the updated mapping of the input bit sequences to the output bit sequences to the second portion of the input data, at 1208.

Figure 13:
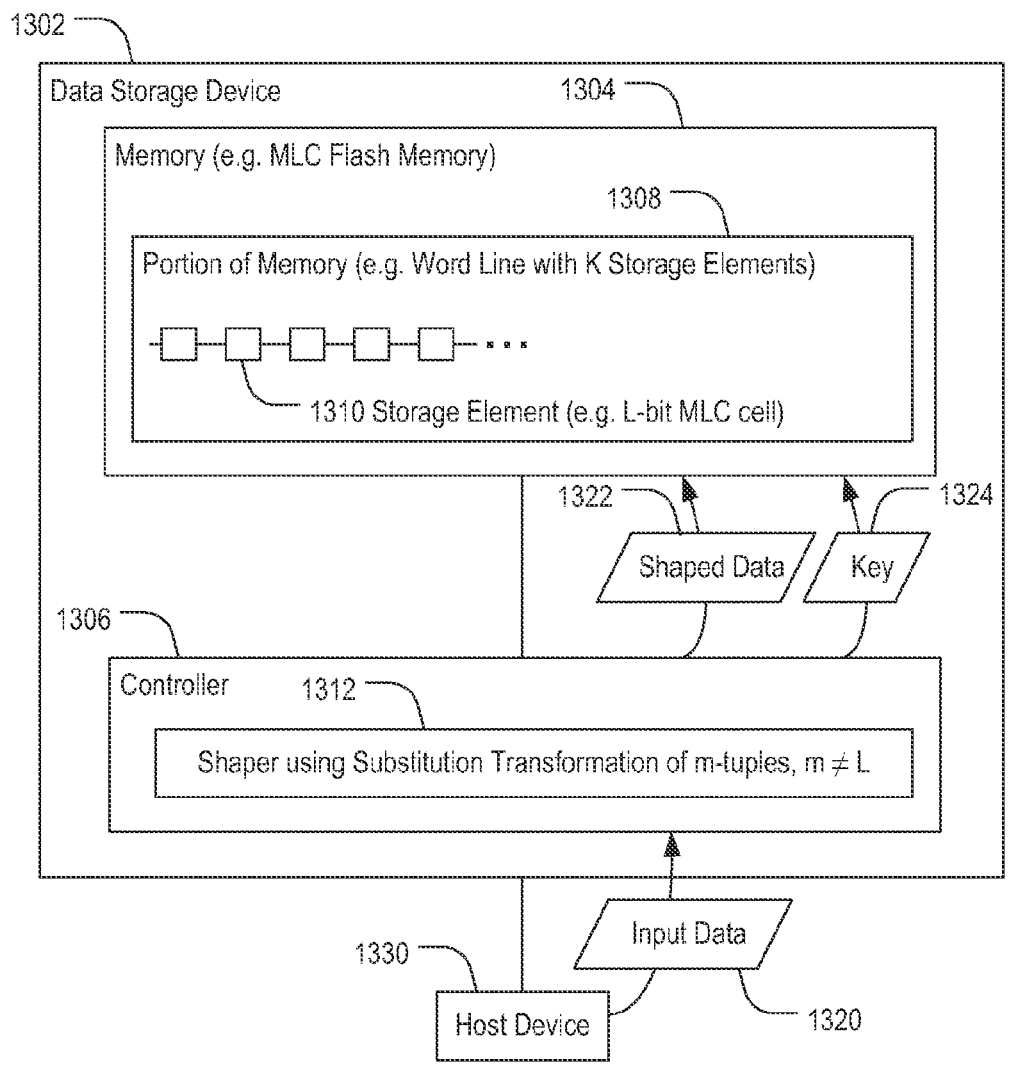
FIG. 13 is a block diagram of a system operative to perform static shaping transformation (SST) encoding.
Figure 14:
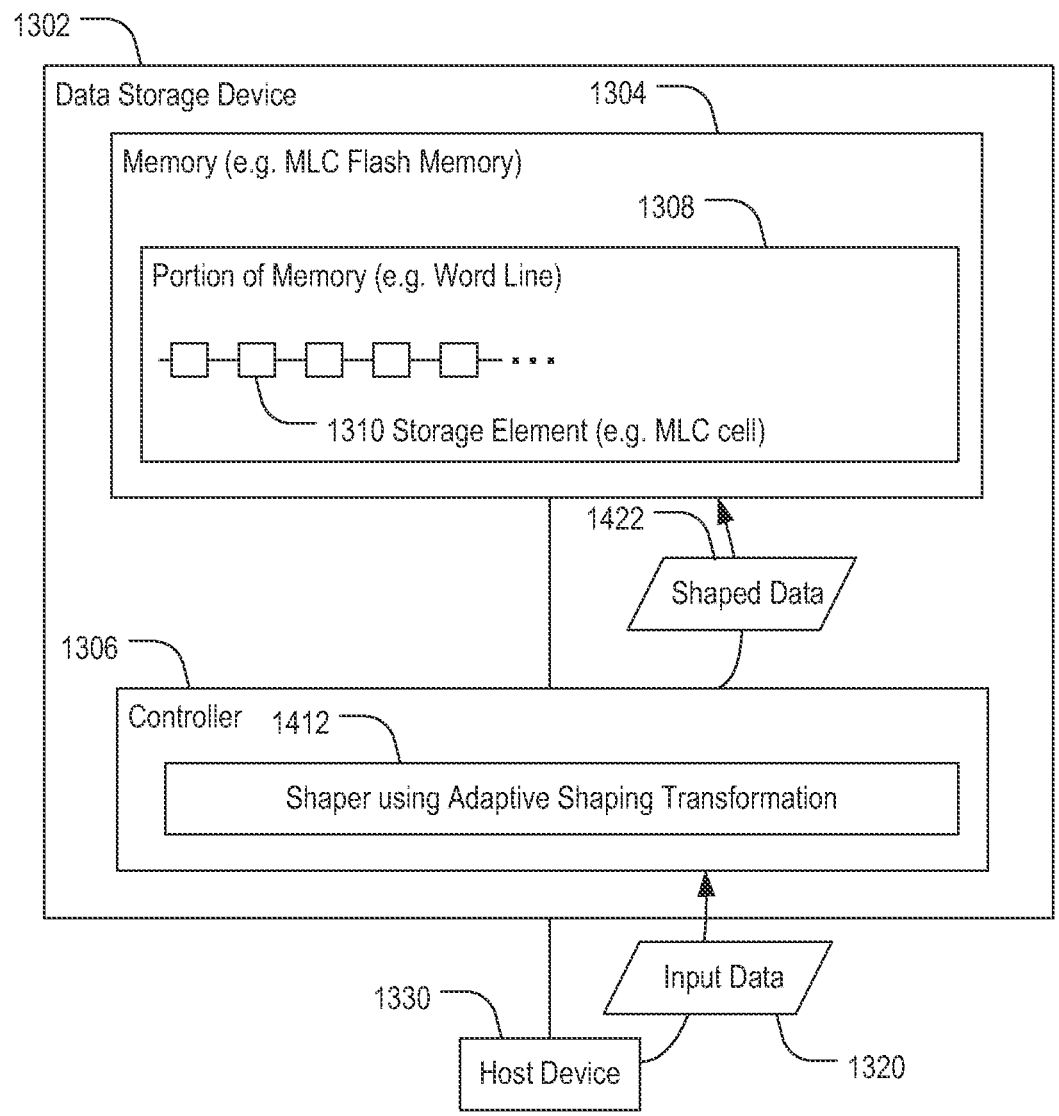
FIG. 14 is a block diagram of a system operative to perform adaptive shaping transformation (AST) encoding.

In a particular embodiment, a data storage device includes a memory and a controller, such as the data storage device 1302 illustrated in FIGS. 13-14. The controller is configured to perform a mapping of bits according to any of the described methods. For example, the controller may be configured to select and apply a substitution transformation such as a SST or an AST. The controller may include a shaper configured to select and apply a substitution transformation to input data. For example, the controller may be configured to perform the transformation selection and may include the transformation unit of FIGS. 2-3, may include the transformation rule and transformation unit of FIG. 4, or any combination thereof.

The data storage device may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device may be embedded memory in the host device, such as eMMC® (trademark of JEDEC Solid State Technology Association, Arlington, Va.) and eSD memory, as illustrative examples.

The data storage device may be configured to be operatively coupled to a host device, such as the host device 1330 of FIGS. 13-14. The host device may be configured to provide data to be stored at the data storage device or to request data to be read from the data storage device. For example, the host device may include a mobile telephone, a music or video player, a gaming console, an electronic book reader, a personal digital assistant (PDA), a computer such as a laptop computer, a notebook computer, or a tablet, any other electronic device, or any combination thereof.

FIG. 13 illustrates an example of system including the data storage device 1302 operatively coupled to the host device 1330. The data storage device 1302 includes a memory 1304 coupled to a controller 1306. The data storage device 1302 is configured to receive input data 1320 and to generate shaped data 1322 and a transformation key 1324 to be stored in the memory 1304.

The memory 1304 may be a multi-level cell (MLC) flash memory. The memory 1304 includes a representative portion 1308. The portion 1308 may include K storage elements, such as a representative storage element 1310. For example, the portion 1308 may be a word line of a MLC memory that includes K MLC cells, and each MLC cell may be configured to store L bits per cell.

The controller 1306 includes a shaper 1312 that is configured to use a substitution transformation of m-tuples, where m is not equal to L. For example the shaper 1312 can implement any of the SST implementations described with respect to FIGS. 1-3, FIG. 8, or any combination thereof. The shaper 1312 is configured to receive an input sequence, such as the input data 1320, and to apply the substitution transformation to generate an output sequence, such as the shaped data 1322. The shaper 1312 is also configured to generate the transformation key 1324 to be stored in association with the shaped data 1322 at the portion 1308.

As an example, the controller 1306 that includes the shaper 1312 may be configured to select, in accordance with an input string of bits, such as the input data 1320, a substitution transformation to apply to the input string. The controller 1306 may apply the substitution transformation to multiple sub-strings of bits of the input string to generate a transformed string of multiple output sub-strings of bits, such as the shaped data 1322. Each output sub-string of bits (e.g. an m-tuple) has a first number (e.g. m) of bits and each sub-string of bits (e.g. an m-tuple) has the first number of bits (e.g. m). The controller 1306 may be configured to program multiple storage elements of the memory 1304 to store the transformed string in the multiple storage elements (e.g. in the portion 1308). Each of the multiple storage elements may store a second number of bits (e.g. L). The second number is not equal to the first number (e.g.

The shaper 1312 may also be configured to perform a substitution transformation to decode shaped data read from the memory 1304. For example, the shaped data 1312 and the transformation key 1324 may be provide to the shaper 1312 in response to a request for the input data 1320 being received from the host device 1330. The shaper 1312 may apply an inverse substitution transformation to restore the input data 1320. To illustrate, the shaper 1312 may operate as described with respect to the transformation selection engine 202 and the transformation unit 204 of FIGS. 2-3.

FIG. 14 illustrates an example of system including the data storage device 1302 operatively coupled to the host device 1330. The data storage device 1302 includes the memory 1304 coupled to the controller 1306. The data storage device 1302 is configured to receive the input data 1320 and to generate shaped data 1422 to be stored in the memory 1304.

The memory 1304 may be a multi-level cell (MLC) flash memory. The memory 1304 includes a representative portion 1308. The portion 1308 may include K storage elements, such as a representative storage element 1310. For example, the portion 1308 may be a word line of a MLC memory that includes K MLC cells.

The controller 1306 includes a shaper 1412 that is configured to use an adaptive shaping transformation. For example the shaper 1312 can implement any of the AST implementations described with respect to FIGS. 4-7, FIGS. 9-12, Tables 1-11, or any combination thereof. The shaper 1412 is configured to receive an input sequence, such as the input data 1320, and to apply the adaptive shaping transformation to generate an output sequence, such as the shaped data 1422, to be stored at the portion 1308. The shaper 1412 is also configured to apply the adaptive shaping transformation to the shaped data 1422 read from the memory 1304 to recover the input data, such as in response to receiving a request for the input data from the host device 1330.

Although various components depicted herein are illustrated as block components and described in general terms, such components may include one or more microprocessors, state machines, or other circuits configured to enable the data storage device to perform the particular functions attributed to such components, or any combination thereof. For example, such block components (e.g. the transformation unit of any of FIGS. 2-4, the shaper 1312 of FIG. 13, the shaper 1412 of FIG. 14) may represent physical components, such as hardware controllers, state machines, logic circuits, or other structures to enable a data storage device to perform an SST encoding or decoding, an AST encoding or decoding, or any combination thereof.

As another example, one or more of the transformation units of FIGS. 2-4, the transformation selection engine of FIGS. 2-3, the transformation rule engine of FIG. 4, the shaper 1312 of FIG. 13, or the shaper 1412 of FIG. 14, or any combination thereof, may be implemented using a programmed microprocessor or microcontroller. In a particular embodiment, a data storage device includes executable instructions that are executed by a processor and the instructions are stored at a memory, such as the flash memory device of any of FIGS. 2-4 or the memory 1304 of FIGS. 13-14. Alternatively, or in addition, executable instructions that are executed by a processor that may be included in a data storage device may be stored at a separate memory location that is not part of a flash memory, such as at a read-only memory (ROM).

In a particular embodiment, a data storage device that implements active or static substitution encoding or decoding may be a portable device configured to be selectively coupled to one or more external devices. For example, the data storage device 1302 of FIGS. 13-14 may be a universal serial bus (USB) flash device or removable memory card. However, in other embodiments, the data storage device may be attached or embedded within one or more host devices, such as within a housing of a portable communication device. For example, the data storage device may be within a packaged apparatus such as a wireless telephone, personal digital assistant (PDA), gaming device or console, portable navigation device, or other device that uses internal non-volatile memory. In a particular embodiment, the data storage device includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of storing data, the method comprising:
in a data storage device including a memory, performing:
selecting, in accordance with an input string of multiple m-tuples of bits, a substitution transformation to apply to the input string, wherein m is an integer greater than 1;
applying the selected substitution transformation to the input string to generate a transformed string of multiple output m-tuples of bits; and
programming K storage elements of the memory to store the transformed string in the K storage elements, each of the K storage elements storing L bits, wherein L is not equal to m.

2. The method of claim 1, wherein the memory includes a flash memory, and wherein each of the K storage elements is a memory cell of the flash memory.

3. The method of claim 1, wherein the memory is operative to selectively program each of the K storage elements to represent each binary number from 0 through $2^L-1$ as a respective one of $2^L$ states of each of the K storage elements, and wherein the substitution transformation is selected to cause a distribution of respective states of the K storage elements to satisfy a predetermined logical condition.

4. The method of claim 3, wherein m is an integer multiple of L, wherein the transformed string is associated with exactly m/L cells, and wherein the logical condition is that states corresponding to lower threshold voltages appear more frequently than states corresponding to higher threshold voltages.

5. The method of claim 1, wherein the substitution transformation is selected to cause a distribution of the output m-tuples of bits that satisfies a predetermined logical condition.

6. The method of claim 5, wherein the input string has a length n and wherein the predetermined logical condition is that a count of 0 bits in the transformed string is less than a multiplicative product of p and n for a predetermined p.

7. The method of claim 1, wherein the substitution transformation is computed by:
  sorting $2^m$ binary m-tuples according to a frequency of each binary m-tuple in the input string; and
  assigning an output m-tuple to each m-tuple of the sorted m-tuples at least partially based on a number of 0 bits in each output m-tuple.

8. The method of claim 1, further comprising:
  storing a key of the selected substitution transformation in the memory in association with the storage elements.

9. The method of claim 8, wherein the key has a number of bits less than or equal to a multiplicative product of m and $2^m$.

10. The method of claim 8, wherein the key includes an ordered list of the output m-tuples of bits corresponding to the substitution transformation.

11. The method of claim 1, wherein programming the K storage elements comprises:
  logically partitioning the transformed string of output m-tuples into L-tuples;
  assigning a number having a value in a range from 0 to $2^L-1$ to each L-tuple to represent a state of a storage element of the K storage elements; and
  programming the K storage elements in accordance with the assigned numbers.

12. A method of storing data corresponding to an input string of multiple m-tuples of bits, wherein m>1, into K storage elements, each storage element storing L bits, the method comprising:
  selecting a first mapping that maps each m-tuple of bits to a corresponding output m-tuple of bits;
  mapping a first at least one m-tuple of bits from the input string to a corresponding first at least one output m-tuple of bits according to the first mapping;
  storing the first at least one output m-tuple of bits into a storage device;
  generating a second mapping that maps each m-tuple of bits to a corresponding output m-tuple of bits, wherein the second mapping is generated at least partially based on the first at least one m-tuple of bits;
  mapping a second at least one m-tuple of bits from the input string to a corresponding second at least one output m-tuple of bits according to the second mapping; and
  storing the second at least one output m-tuple of bits into the storage device.

13. The method of claim 12, wherein the second mapping is generated independent of every m-tuple other than the first at least one m-tuple of bits.

14. The method of claim 12, wherein the second mapping is generated according to the first mapping and according to the first at least one m-tuple of bits.

15. The method of claim 12, wherein the second mapping is generated such that a distribution of the stored output m-tuples satisfies a predetermined logical condition.

16. The method of claim 15, wherein the predetermined logical condition is that a count of 0 bits in an output string that includes the first at least one output m-tuple and the second at least one output m-tuple is less than a count of 0 bits in the input string.

17. The method of claim 15, wherein the predetermined logical condition is that a percentage of 0 bits in an output string that includes the first at least one output m-tuple and the second at least one output m-tuple is less than a predefined number.

18. The method of claim 12, wherein the second mapping is generated such that a distribution of states of storage elements of the storage device in which an output string that includes the first at least one output m-tuple and the second at least one output m-tuple is stored satisfies a predetermined logical condition.

19. The method of claim 18, wherein the storage device is a flash memory storage device and wherein the predetermined logical condition is that a first count of cells having states corresponding to a threshold voltage below a first threshold is greater than a second count of cells having states corresponding to a threshold voltage above a second threshold voltage.

20. The method of claim 18, wherein the storage device is a flash memory storage device and wherein the predetermined logical condition is that a percentage of cells having states corresponding to a threshold voltage below a first threshold is greater than a predefined number.

21. The method of claim 12, wherein m is equal to L.

22. The method of claim 12, wherein m is different from L.

23. A method of storing data corresponding to an input string of multiple m-tuples of bits, wherein m>1, into K storage elements, each storage element storing L bits, the method comprising:
  selecting a first mapping that maps each m-tuple of bits to a corresponding output m-tuple of bits;
  mapping a first m-tuple of bits from the input string to a corresponding first output m-tuple of bits according to the first mapping;
  storing the first output m-tuple of bits into a storage device;
  generating a second mapping that maps each m-tuple of bits to a corresponding output m-tuple of bits, wherein the second mapping is generated at least partially based on the first m-tuple of bits;
  mapping a second m-tuple of bits from the input string to a corresponding second output m-tuple of bits according to the second mapping; and
  storing the second output m-tuple of bits into the storage device, wherein the first m-tuple of the input string equals the second m-tuple of the input string and wherein the first output m-tuple is different from the second output m-tuple.

24. The method of claim 23, wherein generating the second mapping is not a function of any m-tuple other than the first m-tuple of bits.

25. The method of claim 23, wherein the second mapping is generated according to the first mapping and according to the first m-tuple of bits.

26. A method of storing an input string of multiple m-tuples of bits, wherein m>1, in K storage elements with each storage element storing L bits, the method comprising:
  selecting a substitution transformation to apply to the input string to generate a transformed string, wherein the substitution transformation is computed by applying a predefined rule to the input string, wherein the substitution transformation is decodable based on the predefined rule and the transformed string without any external reference, and wherein the transformed string has a distribution of output m-tuples of bits that satisfies a predetermined logical condition;
  applying the selected substitution transformation to the input string to generate the transformed string of output m-tuples of bits; and
  programming the K storage elements to store the transformed string, wherein L is not equal to m.

27. The method of claim 26, wherein application of the predefined rule to each particular m-tuple of the input string depends only on values of previous m-tuples of the input string and the particular m-tuple.

28. The method of claim 26, wherein application of the predefined rule to each particular m-tuple of the input string depends only on values of the particular m-tuple and of previous m-tuples within a predefined window of m-tuples from the particular m-tuple in the input string.

29. The method of claim 26, wherein the substitution transformation of a particular m-tuple in the input string is computed according to a value of a context of k bits preceding the particular m-tuple in the input string.

30. A method comprising:
reading sequential portions of input data and generating output data via a process that includes, for each particular portion of the input data that is read:
generating a corresponding portion of the output data by applying a particular mapping to the particular portion of the input data; and
generating a next mapping to apply to a next portion of the input data, the next mapping based on a history of bits read from the input data, the history of bits including bits of the particular portion.

31. The method of claim 30, wherein the output data is generated in a controller of a data storage device.

32. The method of claim 31, wherein the input data is user data received at the controller of the data storage device, and further comprising storing the output data to a memory of the data storage device.

33. The method of claim 31, wherein the input data is transformed user data that is read from a memory of the data storage device and wherein the process is performed to restore the user data without using any side information corresponding to the transformation of the user data.

34. The method of claim 30, wherein each portion of the input data is an input m-tuple and is mapped to an output M-tuple, wherein M is greater than m.

35. The method of claim 30, wherein each portion of the input data is an input m-tuple and is mapped to an output M-tuple, wherein M is equal to m.

36. The method of claim 30, wherein generating the next mapping includes mapping input bit sequences to output bit sequences according to counts of each of the input bit sequences in the history of bits.

37. The method of claim 36, wherein a particular k-bit value precedes the particular portion in the input data, and wherein the counts of each of the input bit sequences are counts of bit sequences that follow other occurrences of the k-bit value in the history of bits.

38. The method of claim 36, wherein the counts of each of the input bit sequences are counts of bit sequences within a window of W bits preceding the particular portion in the input data.

39. The method of claim 38, wherein values of a weighting factor applied to each bit sequence in the counts of bit sequences are determined according to a relevance of the bit sequence.

40. The method of claim 39, wherein the relevance is based on a repetition pattern in the history of bits read from the input data.

41. The method of claim 30, wherein generating the next mapping includes selecting whether to invert each bits of the next portion according to counts of zero values and one values in the history of bits read from the input data.

42. The method of claim 41, wherein the counts are counts of zero values and one values occurring within a window of bits preceding the next portion in the input data.

43. The method of claim 42, wherein values of a weighting factor applied to each zero value and each one value in the counts are determined according to a repetition pattern in the history of bits read from the input data.

44. A data storage device comprising:
a memory; and
a controller, the controller configured to:
select, in accordance with an input string of bits, a substitution transformation to apply to the input string,
apply the substitution transformation to multiple substrings of bits of the input string to generate a transformed string of multiple output sub-strings of bits, wherein each output sub-string of bits has a first number of bits and each sub-string of bits of the input string has the first number of bits; and
program multiple storage elements of the memory to store the transformed string in the multiple storage elements, each of the multiple storage elements storing a second number of bits, wherein the second number is not equal to the first number.

45. The data storage device of claim 44, wherein the memory includes a flash memory and wherein each of the multiple storage elements is a memory cell of the flash memory.

46. The data storage device of claim 44, wherein the memory is operative to selectively program each of the multiple storage elements to represent each binary number from 0 through $2^L-1$ as a respective one of $2^L$ states of each of the multiple storage elements, wherein L is equal to the second number, and wherein the substitution transformation is selected to cause a distribution of respective states of the multiple storage elements to satisfy a predetermined logical condition.

47. The data storage device of claim 44, wherein the substitution transformation is selected to cause a distribution of the output sub-strings of bits that satisfies a predetermined logical condition.

48. The data storage device of claim 44, wherein the controller is configured to store a key of the selected substitution transformation in the memory in association with the multiple storage elements.

49. The data storage device of claim 48, wherein the key includes an ordered list of the output sub-strings of bits corresponding to the substitution transformation.

50. A data storage device comprising:
a memory; and
a controller, the controller configured to:
generate a first portion of output data by applying a mapping of input bit sequences to output bit sequences to a first portion of input data;
update the mapping of the input bit sequences to the output bit sequences based on the first portion of the input data to generate an updated mapping;
read a second portion of the input data;
generate a second portion of the output data by applying the updated mapping of the input bit sequences to the output bit sequences to the second portion of the input data; and
store the output data to the memory.

51. The data storage device of claim 50, wherein:
the input data is an input string and wherein the input bit sequences are m-tuple of bits, wherein m>1,
wherein the output data is stored into K storage elements in the memory, each storage element storing L bits,
wherein the controller is configured to generate the first portion of output data by:
selecting a first mapping that maps each m-tuple of bits to a corresponding output m-tuple of bits as the mapping of input bit sequences to output bit sequences; and mapping a first at least one m-tuple of bits from the input string to a corresponding first at least one output m-tuple of bits according to the first mapping, wherein the controller is configured to generate an updated mapping by generating a second mapping that maps each m-tuple of bits to a corresponding output m-tuple of bits, wherein the second mapping is generated according to the first mapping and according to the first at least one m-tuple of bits;

wherein the controller is configured to generate the second portion of the output data by mapping a second at least one m-tuple of bits from the input string to corresponding second at least one output m-tuple of bits according to the second mapping, and wherein the controller is configured to store the output data to the memory by storing the first at least one output m-tuple of bits into the memory and storing the second at least one output m-tuple of bits into the memory.

52. The data storage device of claim 51, wherein the first at least one m-tuple of the input string equals the second at least one m-tuple of the input string and wherein the first at least one output m-tuple is different from the second at least one output m-tuple.

53. A method comprising:
encoding an input sequence of n bits into an output sequence of n bits, wherein the n bits of the input sequence are transformed to the n bits of the output sequence via a transformation that changes a distribution of one values and zero values of the n bits of the input sequence without transferring any side information corresponding to the transformation, and wherein the input sequence is encoded such that the output sequence is decodable to generate the input sequence without using any side information corresponding to the transformation; and storing the output sequence of n bits in multiple storage elements of a memory, each of the multiple storage elements storing a number of bits, wherein the number of bits is not equal to n.

54. The method of claim 53, wherein the input sequence corresponds to user data received at a data storage device.

* * * * *